(12) United States Patent
Sannomiya et al.

(10) Patent No.: US 6,441,300 B2
(45) Date of Patent: Aug. 27, 2002

(54) SOLAR BATTERY MODULE

(75) Inventors: Hitoshi Sannomiya, Osaka; Takashi Ouchida, Gose; Hajime Saitoh, Kitakatsuragi-gun, all of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/848,286

(22) Filed: May 4, 2001

(30) Foreign Application Priority Data

May 15, 2000 (JP) ........................................ 2000-141254

(51) Int. Cl.⁷ ...................... H01L 31/048; H01L 31/042
(52) U.S. Cl. .................... 136/251; 136/244; 136/252; 136/256; 136/258; 136/261
(58) Field of Search ................................. 136/244, 251, 136/252, 256, 258, 261

(56) References Cited

U.S. PATENT DOCUMENTS 4,133,697 A * 1/1979 Mueller et al. ............. 136/245
5,059,254 A * 10/1991 Yaba et al. ................. 136/251

FOREIGN PATENT DOCUMENTS

| JP | 8-107230 | | 4/1996 |
| JP | 11-251608 | | 9/1999 |
| JP | 11-256773 | A * | 9/1999 |
| JP | 2001-119051 | A * | 4/2001 |
| JP | 2001-168357 | A * | 6/2001 |

* cited by examiner

Primary Examiner—Alan Diamond
(74) Attorney, Agent, or Firm—Nixon & Vanderhye P.C.

(57) ABSTRACT

In a solar battery module of the present invention, a transparent material is provided on the side opposite the light incident side of a solar cell portion formed on a transparent substrate. The solar battery module further includes a printed matter having a prescribed pattern between the solar cell portion and the transparent material. Thus, by integrating a printed matter having for example an illustration, picture, or character in the solar module, the printed matter can be visually recognized from the back or front side, whereby an appearance of the module can be improved.

11 Claims, 3 Drawing Sheets

SOLAR BATTERY MODULE

BACKGROUND OF THE INVENTION

1. Field of the Invention

The present invention relates to solar battery modules and, more particularly to an improvement in appearance of solar battery modules.

2. Description of the Background Art

The surface color of solar battery modules is usually black or blue in the case of a crystal Si type module and brown or purple in the case of an amorphous Si type module. Generally, a solar battery module has a uniform color over its entire surface. As such, conventional solar battery modules give very dreary and tasteless impressions, exhibiting insipidity. Japanese Patent Laying-Open No. 8-107230 discloses that the surface color of a solar battery module can be variously changed by changing the thickness or refractive index of an anti-reflection film to be formed on the light incident side of the module or by forming the film with a multi-layer structure, and that a character, figure and so on can be displayed by a combination of modules with different surface colors.

However, such a method of varying the surface color of the solar battery module leads to an inferior electricity generating effect, because physical parameters of the anti-reflection film on the light incident side are deviated from values optimum for electricity generation.

The present invention is directed to a light-transmission type solar battery module also, which has a daylighting function in addition to an electricity generating function. For an electricity generating system using such modules, since the back surface of the modules installed at a window or roof can be viewed from inside, the design on the back side of the modules is particularly a major concern. However, the back side of the conventional solar battery modules has been in a rectangular shape of either white or black.

SUMMARY OF THE INVENTION

In view of the above described problem of the conventional art, a major object of the present invention is to give improved appearance to the back side of a solar battery module. The improvement allows the back side of the solar battery module, which has often been concealed heretofore, to be exhibited in a positive manner. Thus, a prescribed pattern, such as a pleasant illustration, picture, figure or character, can be displayed on the back side of the module.

The solar battery module of the present invention is characterized in that a transparent material is provided on the side opposite to the light incident side of a solar cell portion on a transparent substrate, and a printed matter having a desired pattern is provided between the solar cell portion and the transparent material.

Then, a glass substrate, film substrate or transparent protection layer can be used as a transparent material. As the printed matter having a desired pattern, a film or a sheet of paper having such a pattern or an adhesive film such as an EVA (ethylene vinyl acetate) having such a pattern can be used.

For the printed matter, the pattern may be directly printed on the surface of the transparent material.

The solar cell portion may include a thin film solar cell formed of an a-Si (amorphous silicon) or a compound semiconductor.

The solar cell portion may be an integrated thin film cell portion including a plurality of thin film cells, which are divided by parallel grooves and electrically connected in series. The thin film cell portion may be partially removed in a plurality of intermittent line forms which are in parallel with the grooves. Such removed parts in the intermittent line forms can give partial transparency to the solar battery module, providing a daylighting function.

If the solar cell portion is such an integrated thin film cell portion, the thin film cell portion may be partially removed in a plurality of line forms which are orthogonal to the grooves. In this case, the removed portions in the line forms may be continuous, rather than intermittent. This is because the plurality of cells in the thin film cell portion are electrically connected in series in a direction orthogonal to the grooves and thus the removed parts in the line forms do not interfere with such electrical serial connection.

The solar cell portion may be formed including a plurality of crystal Si type solar cells arranged close to one another.

To provide greater visibility to the pattern of the printed matter, the solar battery module may be provided with a light reflection layer adjacent to the printed matter.

In the solar battery module of the present invention, a terminal box for taking out current may preferably be arranged on the side surface of the module not to obstruct visibility of the pattern of the printed matter.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
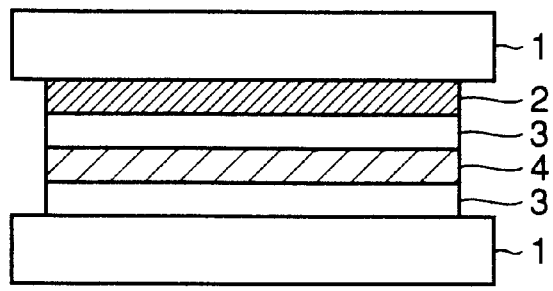
FIG. 1 is a schematic cross sectional view showing an exemplary stacked-layered structure of a solar battery module according to the present invention.

The stacked-layered structure of an a-Si thin film solar battery module according to the first embodiment of the present invention is shown in a schematic cross sectional view of FIG. 1. In the module, a solar cell portion 2 is formed including a transparent electrode, a p layer formed of a-Si:H (hydrogenated amorphous silicon), an i layer formed of a-Si:H, an n layer formed of a-Si:H, and a metal electrode, which are sequentially deposited on a glass substrate 1. A transparent EVA (ethylene vinyl acetate) 3, a film 4, an EVA 3 and a glass 1 are sequentially stacked on solar cell portion 2, which are joined with a prescribed pressure at the temperature of 150° C.

At the time, film 4 has a printed matter in a desired pattern, including an illustration, picture, character, figure and so on. As such, the printed matter of film 4 can be seen from the back side of the solar battery module through glass 1 on the side opposite the light incident side of solar cell portion 2. Thus, the appearance on the back side of the solar battery module, which has been conventionally tasteless, can be dramatically improved.

Then, if there is a terminal box or the like on the back surface of the module as in the conventional case, the appearance of the back surface is deteriorated. Thus, such a terminal box is provided on the side surface of the module for taking current therefrom. In addition, since a name plate indicating a production number, electrical properties, manufacturer, trade mark and so on of that module, which has conventionally been applied to the back surface of the module, may also deteriorate the appearance of the back surface, it is preferable that such information is printed on the film in an unostentatious manner.

Although the film has the printed pattern in the present embodiment, if a sheet of paper contains the printed pattern, such a sheet can be applied to a module without any problem. Note that, for the base material on which printing is to be made, preferably, any material that causes air bubbles and deteriorates the appearance when heated to about 150° C. should not be used.

Although glass substrate 1 is used in the present embodiment, a substrate of a different material may be used as long as it has transparency. Similarly, instead of EVA3, a different material having transparency and adhesiveness may also be used.

Further, although the a-Si thin film solar battery module has been illustrated by way of example, it is needless to say that the present invention can be applied to a thin film solar battery module including a compound semiconductor cell portion. In such a structure, the printed matter in the solar battery module can be seen from the back side. Various examples of the solar battery module having such a structure are shown in FIGS. 2 to 7.

Figure 2:
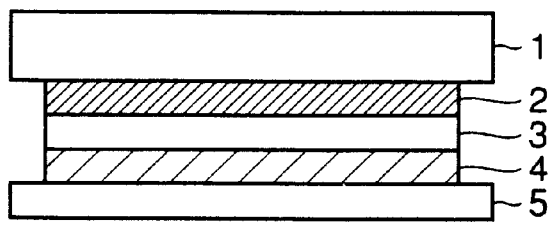
FIG. 2 is a schematic cross sectional view showing another exemplary stacked-layered structure of the solar battery module according to the present invention.

In the solar battery module shown in FIG. 2, stacked on a glass substrate 1 are a solar cell portion 2, an EVA3, and a film 4 having a printed desired pattern, the surface of which is then covered with a transparent resin protection film 5.

Figure 3:
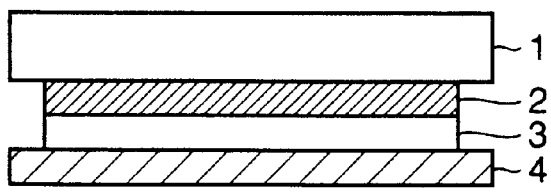
FIGS. 3 to 10 are schematic cross sectional views respectively showing still another exemplary stacked-layered structures of the solar battery modules according to the present invention.

In the solar battery module of FIG. 3, solar cell portion 2, EVA3 and film 4 are sequentially stacked on glass substrate 1, and a pattern is printed on the surface of film 4 on its cell portion side. Note that the pattern may be printed not on film 4 but on the glass. In this case also, the printing surface may be preferably on the cell portion side of the glass.

Figure 4:
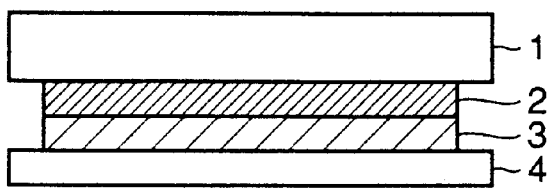

In the solar battery module of FIG. 4, solar cell portion 2, EVA3, and film 4 are stacked on glass substrate 1, and a pattern is directly printed on EVA3, which is then covered by a transparent film 4. Film 4 in this case may also be replaced by glass.

Figure 5:
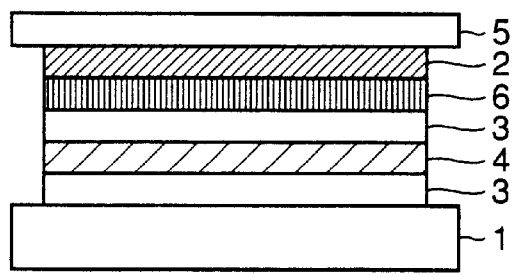

In the solar battery module of FIG. 5, an a-Si solar cell portion 2 and protection film 5 are stacked on the front surface of substrate 6 such as a metal or film. In addition, EVA3, film 4 having a printed matter of a prescribed pattern, EVA3, and glass 1 are sequentially stacked on the back surface of substrate 6. Needless to say, a stacked-layered structure similar to that on the back surface of cell layer 2 of FIGS. 2 to 4 can be formed on the back surface of substrate 6. In the case where the substrate such as a metal or film is used, a flexible solar battery module can be produced for use on a curved surface.

Figure 6:

In the solar cell module of FIG. 6, a solar cell portion 2 and protection film 5 are stacked on substrate 6 of a metal or film. On the back surface of substrate 6, a prescribed pattern including an illustration, picture, figure, or character is printed. Note that the printing surface may be preferably protected by an additional protection film.

Figure 7:
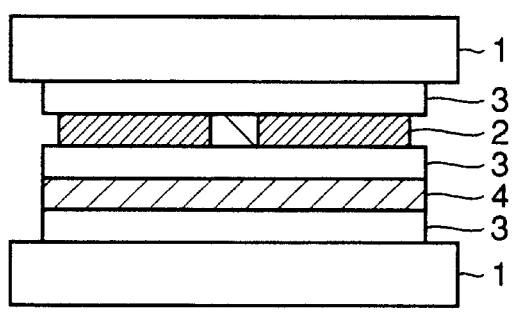

Although the solar battery module of FIG. 7 is similar to that of FIG. 1, cell portion 2 of the module of FIG. 7 differs from that of FIG. 1 in that a plurality of crystal Si type solar cells are arranged close to one another. Namely, in the module of FIG. 7, EVA3, solar cell portion 2 including a plurality of crystal cells, EVA3, film 4, EVA3, and glass 1 are sequentially stacked on glass substrate 1, and the back surface of the module can be formed with a design.

Second Embodiment

Figure 8:
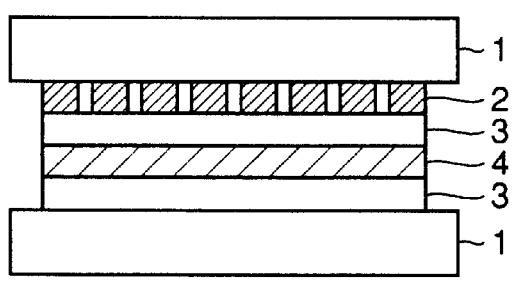

In the solar cell module of FIG. 8 according to the second embodiment of the present invention, a transparent electrode, p layer formed of a-Si:H, i layer formed of a-Si:H, n layer formed of a-Si:H, and metal electrode are sequentially stacked to form a thin film cell portion 2 on glass substrate 1. Then, thin film cell portion 2 is partially removed by laser to allow partial light transmission. An a-Si thin film solar battery module using a glass substrate is generally made in an integrated structure where a plurality of thin film cells divided by parallel grooves are electrically connected in series in a direction orthogonal to these grooves. However, if the light transmissible parts are formed in parallel with the grooves, such light transmissible parts must be formed in a plurality of intermittent line forms e.g., in dotted line forms, not to obstruct current. On the other hand, if the light transmissible parts are formed in a direction orthogonal to the grooves, the light transmissible parts need not be formed in the intermittent line form, but may be formed in continuous line form. The form of the light transmissible parts is a matter of designing, and a solar battery module with light transmissible parts in either form can be manufactured.

On thin film cell portion 2 thus formed, EVA3, film 4, EVA3, and glass 1 are sequentially stacked and joined with a prescribed pressure at 150° C.

The solar battery module of FIG. 8 thus formed not only has improved appearance of the back surface, but also finds a variety of applications, owing to the appearance like a stained glass.

Third Embodiment

Figure 9:
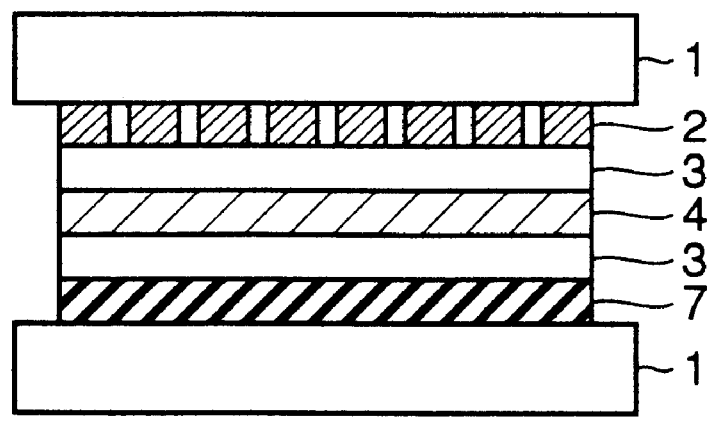

In the solar battery module of FIG. 9 according to the third embodiment of the present invention, a transparent electrode, p layer formed of a-Si:H, i layer formed of a-Si:H, n layer formed of a-Si:H, and metal electrode are sequentially stacked on glass substrate 1 to form a thin film cell portion 2, which is then partially removed by laser to allow partial light transmission. An a-Si:H thin film solar battery module using a glass substrate is generally made in an integrated structure where a plurality of thin film cells divided by parallel grooves are electrically connected in series in a direction orthogonal to the grooves. If the light transmissible parts are formed in parallel with the grooves, the light transmissible parts may be formed in a plurality of intermittent line forms, e.g., dotted line forms, not to obstruct current. On the other hand, if the light transmissible parts are formed in the direction orthogonal to the groove, the light transmissible parts need not be formed in the intermittent line forms, but may be formed in continuous line forms. The form of the light transmissible parts is a matter of designing, and a solar battery module having light transmissible parts in any form can be manufactured.

On thin film cell portion 2 thus formed, EVA3, film 4, EVA3, and glass 1 coated with a highly reflective metal 7 such as Al are sequentially stacked and joined with a prescribed pressure at 150° C.

In this case, the light entering the solar battery module is reflected by a reflection layer 7 and then returns to the front surface side of the module. Thus, an illustration, picture, figure or character printed on film 4 can be seen from the front side. As a result, the appearance of not only the back but the front side of the module can be improved.

Fourth Embodiment

Figure 10:
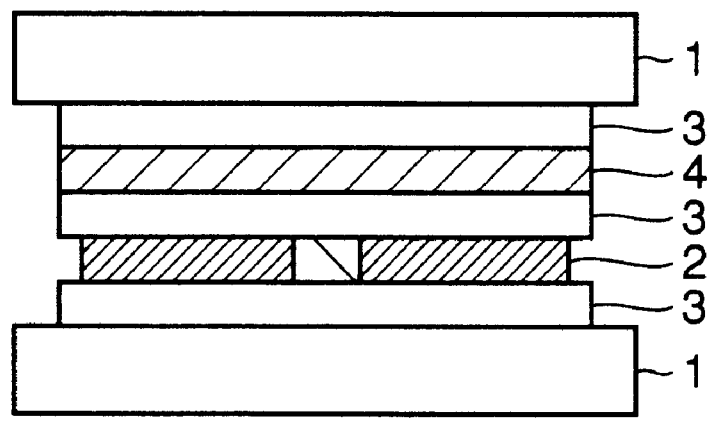

The solar battery module of FIG. 10 according to the fourth embodiment of the present invention is of a type including a cell portion 2 formed of a plurality of crystal Si type cells arranged adjacent to one another, and a printed matter such as film 4 is provided on the front side of cell portion 2. Namely, EVA3, film 4, EVA3, cell portion 2, EVA 3 and glass 1 are sequentially stacked and applied on glass substrate 1. In this case, a photoelectric conversion efficiently is lowered because of the light incident on cell portion 2 through the printed matter. However, the front surface appearance of the solar battery module can be improved.

Fifth Embodiment

Although an illustration, picture, character and so on can be seen on the back or front surface of the above described solar battery module, a plurality of modules can be combined to provide a solar battery array representing an illustration, picture, character and so on. A solar electricity generating system is installed on the south side of a roof, occupying a considerable area. The figures respectively printed on solar battery modules may not be visually recognized from a great distance. A geometric pattern may be relatively easy to recognize. However, if a pattern involves detailed illustrations, such a fine pattern cannot be visually recognized. In such a case, preferably, a solar battery module array including a plurality of modules in combination represents a single design.

Sixth Embodiment

Although the solar battery module of the present invention can be installed at various sites, a solar battery module array is usually formed of modules of uniform size. However, if it is desired to give a uniform design to the overall roof including the portion where solar battery modules are not provided, a dummy module is required to provide a uniform appearance. In such a case, a dummy module with a printed matter identical to that of the solar battery module is used to provide uniformity in designing over the roof in its entirety.

The structure of such a dummy module is basically the same as the above described solar battery module. In the dummy module, the solar cell portion is not included, but a film, a sheet of paper or the like with a printed cell portion pattern is inserted.

If daylighting by means of e. g., roof skylight, is desired, a variety of illustrations, pictures, figures, characters and so on can be given to the dummy module to provide excellent appearance.

As described above, according to the present invention, the design on the back side of the solar battery module, which has conventionally been tasteless, is improved, and the back side can be displayed in a positive manner.

In addition, the thin film cell portion of the solar battery module may be partially removed in line forms, whereby the removed parts allow partial transmission of light from the light incident side to the back side of the module. As a result, a printed matter including an illustration, picture, figure and so on can be finely illuminated with the transmitted light.

Moreover, by providing the terminal box, which has conventionally been provided on the back surface of the solar battery module, on the side surface of the module, the appearance on the back side can be prevented from deteriorating.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A solar battery module, comprising:

a transparent material provided on a side opposite a light incident side of a solar cell portion on a transparent substrate, the solar cell portion including an opaque back electrode provided between printed matter and the light incident side of the solar cell portion, and the printed matter having a prescribed pattern designed to cause pleasant feeling to human beings between said solar cell portion and said transparent material, the printed matter being printed on a substance or material other than an adhesive film.

2. The solar battery module according to claim 1, wherein said printed matter is directly printed on a surface of said transparent material.

3. The solar battery module according to claim 1, wherein said solar cell portion is formed of an a-Si or compound semiconductor.

4. The solar battery module according to claim 3, wherein said solar cell portion is an integrated thin film cell portion including a plurality of thin film cells divided by parallel grooves and electrically connected in series, and said thin film cell portion is partially removed in a plurality of intermittent line forms parallel to the grooves.

5. The solar battery module according to claim 3, wherein said solar cell portion is an integrated thin film cell portion including a plurality of thin film cells divided by parallel grooves and electrically connected in series, and said thin film cell portion is partially removed by a plurality of parallel line forms orthogonal to the grooves.

6. The solar battery module according to claim 1, wherein said solar cell portion includes a plurality of crystal Si solar cells arranged adjacent to one another.

7. The solar battery module according to claim 1, wherein a light reflection layer is provided between said solar cell portion and said printed matter.

8. The solar battery module according to claim 1, wherein said solar battery module further comprises a terminal box for taking out current and said terminal box is positioned on a side surface of said solar battery module.

9. The solar battery module of claim 1, wherein the pattern of the printed matter comprises a character, a figure, a photograph, or a geometrically designed pattern.

10. A module comprising:

a solar cell supported by a substrate, the solar cell comprising at least one semiconductor layer and an opaque back electrode, the semiconductor layer of the solar cell being provided between the opaque back electrode and the substrate;

a transparent layer comprising a polymer; and a printed pattern comprising a printed character, picture and/or photograph provided between the solar cell and the transparent layer.

11. The module of claim 10, wherein the printed pattern is printed directly on the transparent layer.

* * * * *